(12) United States Patent
Sohda et al.

(10) Patent No.: US 10,629,405 B2
(45) Date of Patent: Apr. 21, 2020

(54) ELECTRON BEAM DEVICE AND SAMPLE INSPECTION METHOD

(71) Applicant: HITACHI, LTD., Tokyo (JP)

(72) Inventors: Yasunari Sohda, Tokyo (JP); Momoyo Enyama, Tokyo (JP); Megumi Kimura, Tokyo (JP); Koichi Hamada, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/276,195

(22) Filed: Feb. 14, 2019

(65) Prior Publication Data

US 2019/0287757 A1 Sep. 19, 2019

(30) Foreign Application Priority Data

Mar. 14, 2018 (JP) ................................. 2018-046558

(51) Int. Cl.
*H01J 37/22* (2006.01)
*H01J 37/28* (2006.01)
(Continued)

(52) U.S. Cl.
CPC ........ *H01J 37/222* (2013.01); *H01J 37/1471* (2013.01); *H01J 37/28* (2013.01); *H01J 37/285* (2013.01)

(58) Field of Classification Search
CPC ...... H01J 37/22; H01J 37/222; H01J 37/1471; H01J 37/28; H01J 37/285
See application file for complete search history.

(56) References Cited

U.S. PATENT DOCUMENTS

| 6,274,876 | B1* | 8/2001 | Kawanami | G01N 23/00 250/307 |
| 2011/0139980 | A1* | 6/2011 | Nakano | H01J 37/153 250/307 |
| 2017/0025251 | A1* | 1/2017 | Enyama | H01J 37/265 |

FOREIGN PATENT DOCUMENTS

| JP | H04-341741 A | 11/1992 |
| JP | 06-124883 A | 5/1994 |

(Continued)

OTHER PUBLICATIONS

Korean Office Action dated Dec. 5, 2019 for the Korean Patent Application No. 10-2018-0164694.

*Primary Examiner* — David E Smith
(74) *Attorney, Agent, or Firm* — Volpe and Koenig, P.C.

(57) ABSTRACT

An electron beam device suitable for observing the bottom of a deep groove or hole with a high degree of accuracy under a large current condition includes: an electron optical system having an irradiation optical system to irradiate a first aperture with an electron beam emitted from an electron source and a reduction projection optical system to project and form an aperture image of the first aperture on a sample, detectors to detect secondary electrons emitted by irradiating the sample with the electron beam through the electron optical system. An image processing unit generates a two-dimensional image from detection signals obtained by irradiating the sample while the electron beam scans the sample two-dimensionally by scanning deflectors of the electron optical system. Further, generates a reconstructed image by deconvoluting electron beam intensity distribution information of an ideal aperture image of the first aperture from the generated two-dimensional image information.

13 Claims, 13 Drawing Sheets

(51) Int. Cl.
*H01J 37/147* (2006.01)
*H01J 37/285* (2006.01)

(56) References Cited

FOREIGN PATENT DOCUMENTS

| | | |
|---|---|---|
| JP | 11-040096 A | 2/1999 |
| JP | 2017-027829 A | 2/2017 |

* cited by examiner

ELECTRON BEAM DEVICE AND SAMPLE INSPECTION METHOD

CROSS-REFERENCE TO RELATED APPLICATION

This application claims priority to Japanese Patent Application No. 2018-046558 filed on Mar. 14, 2018, the entire contents of which are incorporated by reference herein.

TECHNICAL FIELD

The present invention relates to: an electron beam device to carry out observation, inspection, and measurement by using an electron beam; and a sample inspection method using the electron beam device.

BACKGROUND ART

An electron beam device such as a scanning electron microscope (SEM) used for observing, inspecting, and measuring a sample with an electron beam irradiates the sample by accelerating electrons emitted from an electron source and converging the electrons on the sample surface by an electrostatic lens or an electromagnetic lens. Such electrons are referred to as primary electrons. Secondary electrons (electrons of low energies are referred to as secondary electrons and electrons of high energies are referred to as backscattered electrons dividedly in some cases) are emitted from the sample by the incidence of the primary electrons. A scanning image of a fine pattern and a composition distribution of the surface of a sample can be obtained by detecting such secondary electrons while an electron beam is deflected and scans the surface of the sample. Further, an absorbed current image can also be formed by detecting electrons absorbed in a sample.

In scanning electron microscopy, it is necessary to increase the amperage of an electron beam and thus increase a signal amount for observing the bottom of a deep groove or a deep hole or measuring high-precision pattern dimensions. Moreover, unless an aperture angle of an electron beam is reduced, a beam blur caused by a defocus increases and it comes to be difficult to observe the bottom of a deep groove or a deep hole separately from the upper part. If an aperture angle is reduced while an amperage is maintained, an electron source image glows large and a resolution lowers.

Because of this, a method for improving the resolution of an image obtained by image processing is known. A method of estimating the size and the profile of a primary beam and processing an image by using Fourier transformation on the basis of the estimation is disclosed in Patent Literature 1 and Patent Literature 2.

CITATION LIST

Patent Literature

Patent Literature 1: Japanese Unexamined Patent Application Publication No. Hei 4-341741
Patent Literature 2: Japanese Unexamined Patent Application Publication No. 2017-27829

SUMMARY OF INVENTION

Technical Problem

In Patent Literature 1 and Patent Literature 2, a method for accurately measuring the intensity distribution of a primary beam used for image processing is not clarified. Because a conventional scanning electron microscope forms an image of an electron source on a sample, the intensity distribution of a primary beam is decided by an electron source image, an optical aberration, a beam vibration, and the like. Further, the influence of electron beam scattering in the interior of a sample appears also in an acquired image. In those factors, an electron source image is one of the factors dominating the intensity distribution of a primary beam because the detection efficiency of signal electrons is low and hence a large current is required in the case of observing a deep groove or a deep hole. In this case, it is extremely difficult to accurately grasp an electron source image and hence it is impossible to improve the resolution of an image by processing the image with a high degree of accuracy. Further, that the size of an electron source image cannot be controlled also causes beam characteristic difference (machine difference) between electron beam devices.

The present invention provides an electron beam device suitable for observing the bottom of a deep groove or a deep hole with a high degree of accuracy under large current conditions.

Solution to Problem

An electron beam device according to an embodiment of the present invention has an electron optical system having an irradiation optical system to irradiate a first aperture with an electron beam emitted from an electron source and a reduction projection optical system to project and form an aperture image of the first aperture on a sample, a detector to detect secondary electrons emitted by irradiating the sample with the electron beam through the electron optical system, and an image processing unit to generate a two-dimensional image from detection signals of the detector obtained by irradiating and scanning the sample with the electron beam two-dimensionally by a scanning deflector of the electron optical system and the image processing unit generates a reconstructed image by deconvoluting electron beam intensity distribution information of an ideal aperture image of the first aperture from the two-dimensional image information generated from the detection signals.

Other problems and novel features will be obvious from the descriptions and attached drawings of the present description.

Advantageous Effects of Invention

Even under large current conditions, a high-resolution image can be obtained by image processing and particularly a deep groove or a deep hole is observed effectively.

DESCRIPTION OF EMBODIMENTS

Embodiments according to the present invention are explained in reference to the drawings. Although the present invention is explained on the basis of a scanning electron microscope here, the present invention can be applied also to an electron beam device other than a scanning electron microscope.

Figure 1:
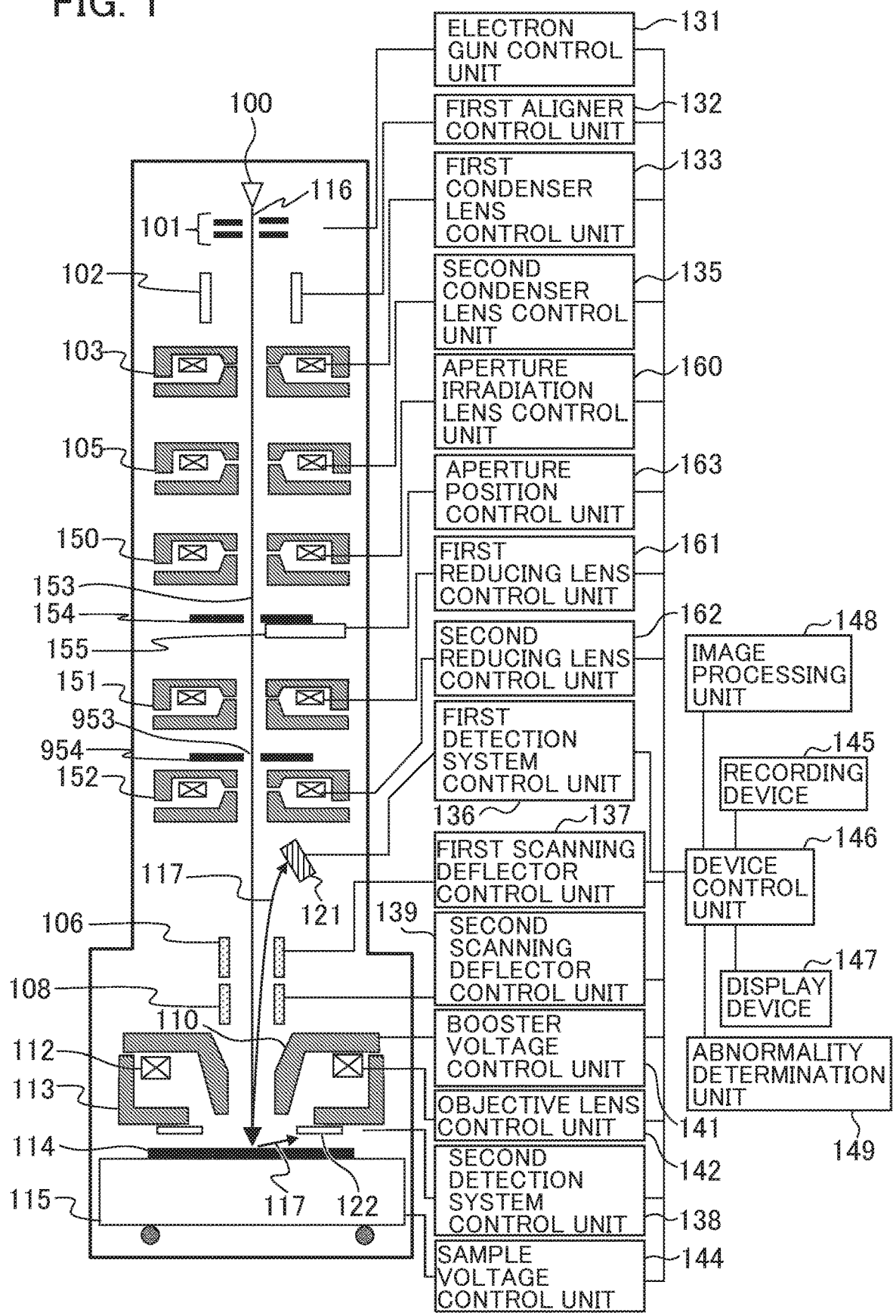
FIG. 1 is an overall schematic diagram of a scanning electron microscope.

FIG. 1 is an overall schematic diagram showing a scanning electron microscope according to an embodiment of the present invention. An electron beam (primary electrons 116) emitted from an electron source 100 with an electron gun 101: passes through three-stage lenses of a first condenser lens 103, a second condenser lens 105, and an aperture irradiation lens 150; and is emitted to a first aperture plate 154. A first aperture 153 is formed in the first aperture plate 154. Further, the first aperture 153 is arranged so that the position of the aperture relative to an electron beam may be adjusted by an aperture position control unit 163 to control an aperture plate stage 155. An electron beam having passed through the first aperture 153: passes through three-stage lenses of a first reducing lens 151, a second reducing lens 152, and an objective lens 113; and is emitted to a sample 114 retained by a stage 115. An image (aperture image) of the first aperture 153 is projected and formed on the sample 114 by the electron optical system, the details being described later. The first aperture 153 is desirably a round aperture. The reason is that a round aperture is isotropic and hence image processing is easily performed.

Meanwhile, in this configuration example, since an electrostatic lens is formed by applying a positive voltage to a magnetic path 110 over the objective lens from a booster voltage control unit 141 and a negative voltage to the sample 114 from a sample voltage control unit 144, the objective lens 113 is a magnetic-electric field superimposing lens. Further, a magnetic path aperture of the objective lens 113 is directed to the side of the sample 114 and a lens structure called a semi-in-lens type is formed. An objective lens control unit 142 controls an excitation current flowing in an objective lens col 112. Further, a second aperture plate 954 may be installed between the first reducing lens 151 and the second reducing lens 152. A second aperture 953 is formed in the second aperture plate 954. The purpose of the second aperture 953 is to control an interference effect as the waves of an electron beam and that makes it possible to control a diffraction aberration and a beam blur during defocusing. The size of the second aperture 953 is desirably larger than the half width of an electron beam at the aperture position and moreover influences given to other electron beam characteristics can be ignored by transmitting most of the electron beam.

Secondary electrons 117 (low-speed electrons are classified as secondary electrons and high-speed electrons are classified as backscattered electrons in some cases) emitted by irradiating the sample 114 with an electron beam are detected by a first detector 121 located in the middle of a reduction projection optical system (an electron optical system of a scanning electron microscope is classified between above and below a first aperture plate 154 and an electron optical system from the first aperture plate 154 to the side of the sample 114 is referred to as a reduction projection optical system and an electron optical system from the electron source 100 to the first aperture plate 154 is referred to as an irradiation optical system) or a second detector 122 located at the bottom of the objective lens 113. The first detector 121 is controlled by a first detection system control unit 136 and the second detector 122 is controlled by a second detection system control unit 138. Primary electrons 116 scan the sample 114 two-dimensionally by a first scanning deflector 106 and a second scanning deflector 108 and resultantly two-dimensional image information of the sample 114 can be obtained. Two-dimensional scanning is generally carried out while the start point of line scanning in a lateral direction is shifted in a longitudinal direction. The center position of the two-dimensional image information is decided by the first scanning deflector 106 controlled by a first scanning deflector control unit 137 and the second scanning deflector 108 controlled by a second scanning deflector control unit 139. In this example, the first scanning deflector 106 and the second scanning deflector 108 comprise electrostatic deflectors respectively.

Meanwhile, the electron gun 101 is controlled by an electron gun control unit 131, the first condenser lens 103 is controlled by a first condenser lens control unit 133, the second condenser lens 105 is controlled by a second condenser lens control unit 135, the aperture irradiation lens 150 is controlled by an aperture irradiation lens control unit 160, the first reducing lens 151 is controlled by a first reducing lens control unit 161, and the second reducing lens 152 is controlled by a second reducing lens control unit 162. Further, a first aligner 102 to control the beam axis of the primary electrons 116: is arranged at the latter stage of the electron gun 101; and is controlled by a first aligner control unit 132. The control units for the components and detectors in the electron optical system are controlled integrally by a device control unit 146 to control the whole devices on the basis of control data and the like stored in a recording device 145. A detection signal detected by the first detector 121 or the second detector 122 is stored in the recording device 145. An image processing unit 148 generates a two-dimensional image from a detection signal and the generated two-dimensional image is stored in the recording device 145 or displayed in a display device 147. Further, an abnormality determination unit 149 extracts a defect candidate from two-dimensional image information generated from a detection signal.

Figure 2:
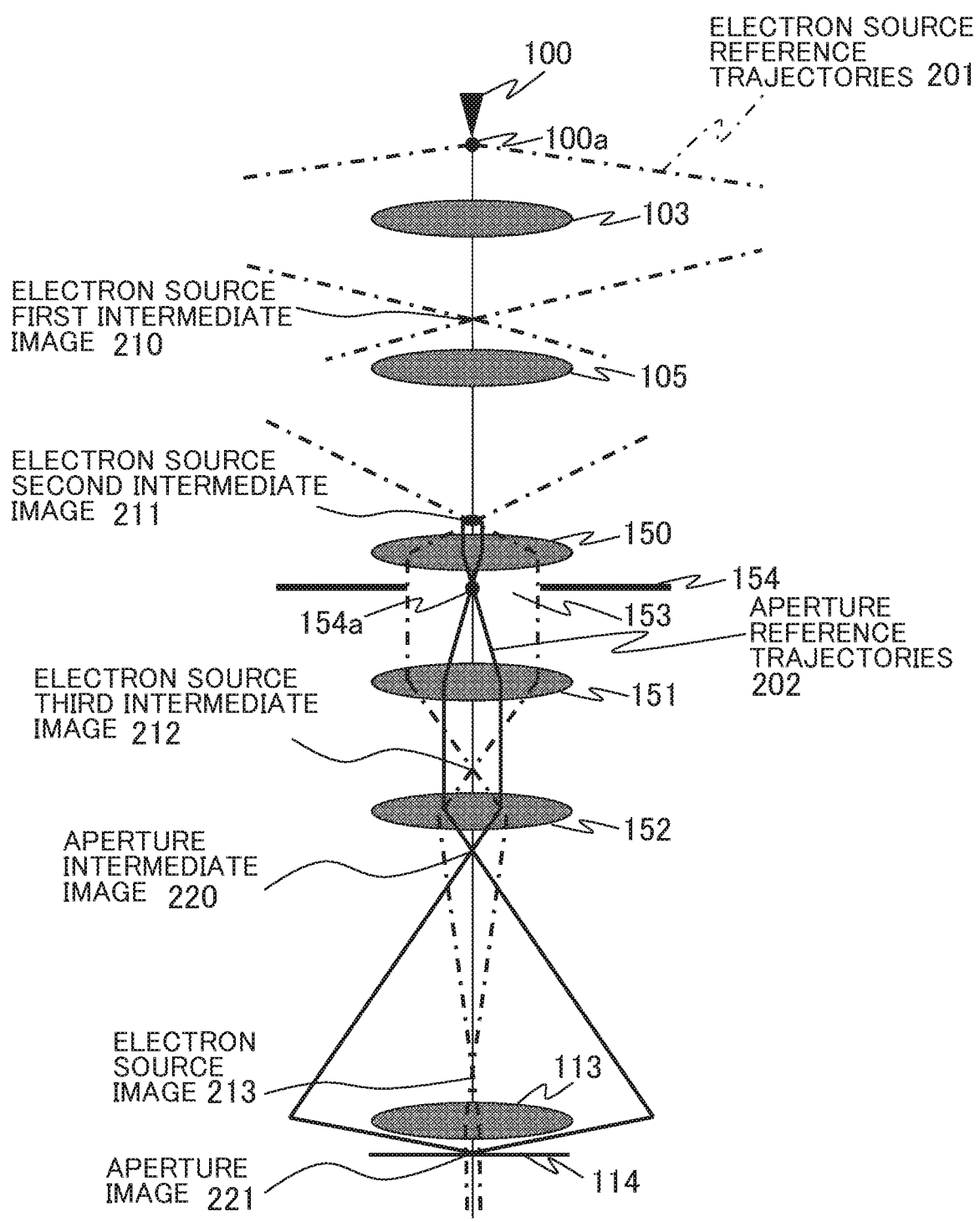
FIG. 2 is a view explaining the electron trajectories of a scanning electron microscope.

Reference trajectories of electrons in the electron optical system of the scanning electron microscope in FIG. 1 are shown in FIG. 2. As the reference trajectories, electron source reference trajectories 201 (dot-dash lines) having an electron source center 100a as an object point and aperture reference trajectories 202 (solid lines) having an aperture center 154a as an object point are shown. In the electron source reference trajectories 201, electron beams having the electron source center 100a as the object point: form an electron source second intermediate image 211 by the two condenser lenses 103 and 105; and are emitted to the aperture plate 154 as parallel beams by the aperture irradiation lens 150. The parallel beams having passed through the aperture 153 form an electron source image 213 by the two reducing lenses 151 and 152. On this occasion, the electron source image 213 is controlled so as to be formed on a back focal plane of the objective lens 113.

Figure 3:
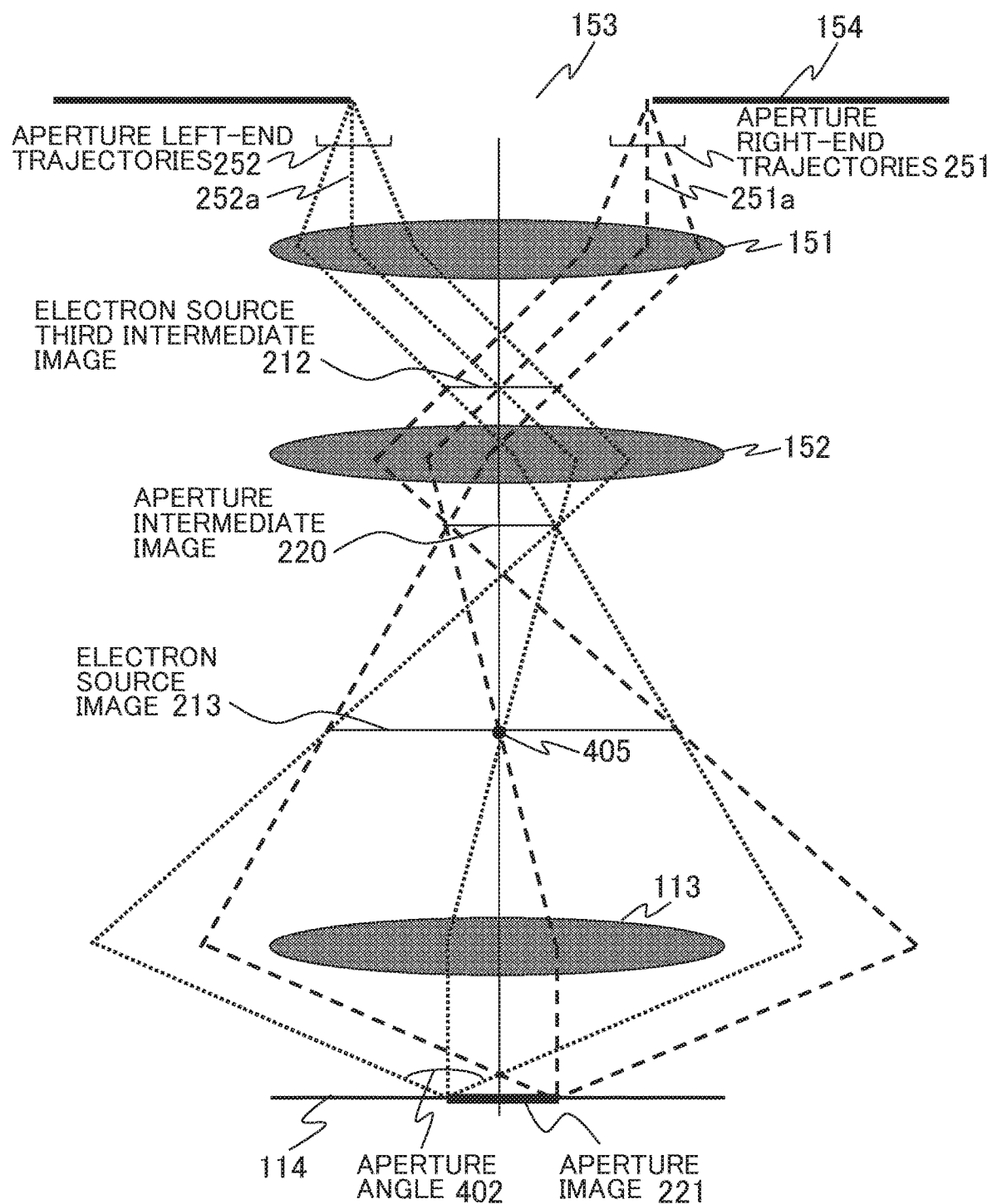
FIG. 3 is a view showing the details of aperture reference trajectories in FIG. 2.

Meanwhile, in the aperture reference trajectories 202, electron beams having the aperture center 154a as the object point form a reduced aperture image 221 of the aperture 153 on the sample 114 by the two reducing lenses 151 and 152 and the objective lens 113. Details of the aperture reference trajectories 202 are shown in FIG. 3. FIG. 3 shows electron trajectories in three directions originated from each of the right end and the left end of the aperture 153 (referred to as aperture right-end trajectories 251 (broken lines) and aperture left-end trajectories 252 (dotted lines), respectively) in the electron trajectories of projecting and forming the aperture 153 of the aperture plate 154 as the aperture image 221 on the sample 114. The situation that the electron trajectories form an aperture intermediate image 220 by the first reducing lens 151 and the second reducing lens 152 and then are projected and formed as the aperture image 221 on the sample 114 at a magnification conforming to lens conditions is shown.

Figure 4A:
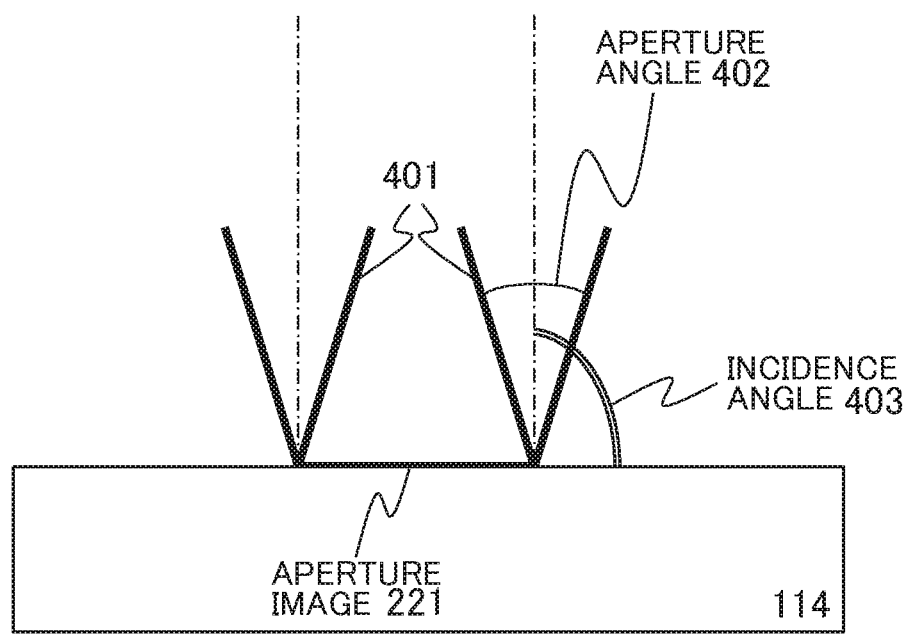
FIG. 4A is a view showing electron trajectories in the vicinity of a sample.

Electron trajectories in the vicinity of the sample 114 are shown in FIG. 4A. Primary electrons 401 of electron trajectories having both the ends of the aperture 153 of the aperture plate 154 as object points: are shown in the figure; and focus on the sample 114 at the angle of an aperture angle 402 by the electron trajectories shown in FIG. 3. The aperture image 221 is formed between the left and right focus positions. Further, an angle between a trajectory passing through the center of each of aperture angles 402 and the sample surface is an incidence angle 403 and both the left and right incidence angles 403 are about 90 degrees in the present embodiment. The state is called telecentric and is an important electron beam characteristic in the observation of a deep groove and a deep hole. The purpose of forming an electron source image 213 on the back focal plane of the objective lens 113 as explained in FIG. 2 is to materialize this state. In other words, the back focal plane of the objective lens 113 is a position where parallel beams focus when the parallel beams enter in the optical axis direction from the sample side toward the objective lens 113. As shown in FIG. 3, a trajectory 251a going straight in the optical axis direction in the aperture right-end trajectories 251 and a trajectory 252a going straight in the optical axis direction in the aperture left-end trajectories 252 enter a point 405 at the position of the electron source image 213 by the two reducing lenses 151 and 152. Since the point 405 is a point on the back focal plane of the objective lens 113, an electron beam entering the objective lens 113 from the point 405 has an electron trajectory vertically entering the sample surface.

Figure 4B:
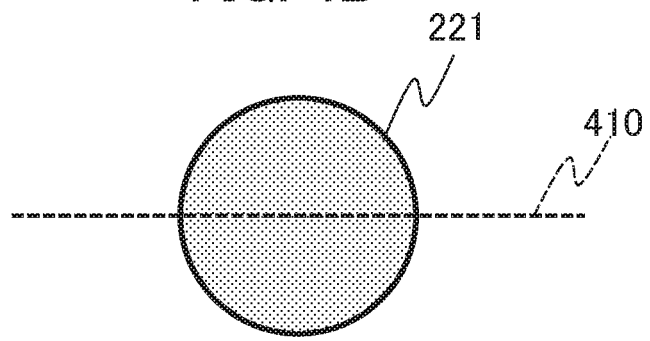
FIG. 4B is a view showing an aperture image 221 formed on a sample.
Figure 5A:
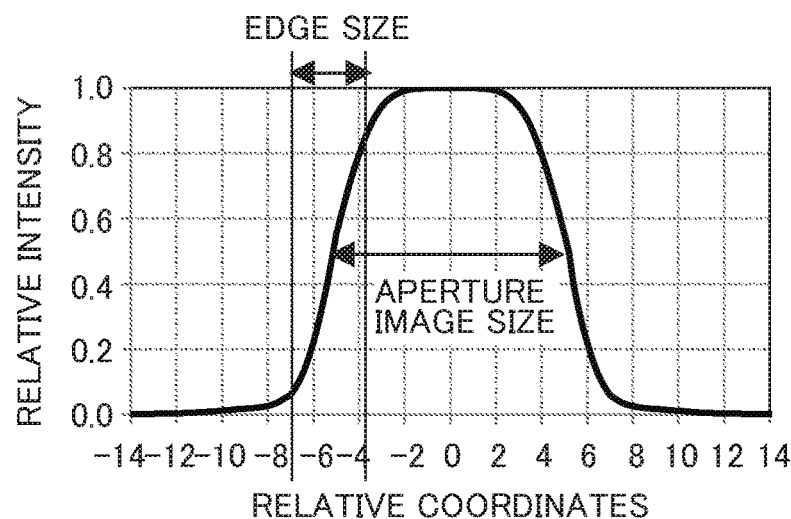
FIG. 5A is an electron beam intensity distribution of an aperture image.
Figure 5B:
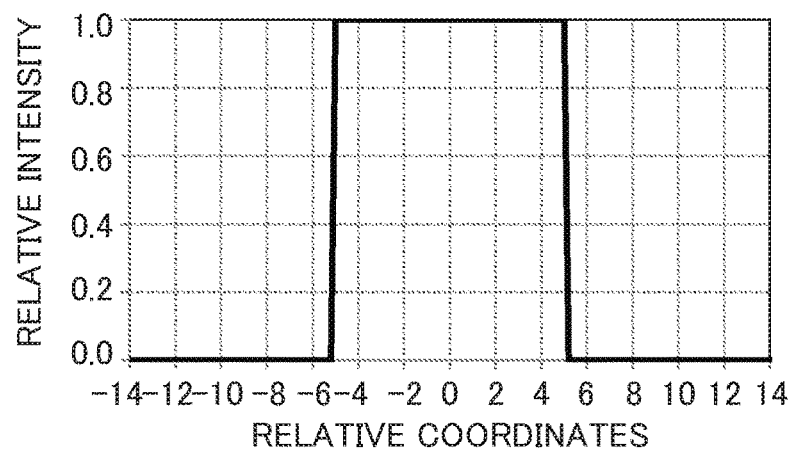
FIG. 5B is an electron beam intensity distribution of an ideal aperture image.

FIG. 4B shows an aperture image 221 formed on a sample 114 when an aperture 153 of an aperture plate 154 is a round aperture. Electron beam intensity distributions obtained from an aperture image 221 according to the present embodiment are explained in reference to FIGS. 5A to 5C. FIG. 5A is an electron beam intensity distribution (beam profile) of an aperture image 221. Here, an electron beam intensity distribution of an aperture image 221 is represented by a one-dimensional distribution in a center 410 (refer to FIG. 4B) of the aperture image 221. The same applies to FIGS. 5B and 5C hereunder. In the electron beam intensity distribution of the aperture image 221, the electron beam intensity lowers at the edge part of the aperture image in comparison with an electron beam intensity distribution of an ideal aperture image shown in FIG. 5B. A width of a whole aperture image is referred to as "aperture image size" and a width of an edge part is referred to as "edge size". For example, an aperture image size is defined as a width of an electron beam intensity distribution at a level where a relative intensity is 0.5 and an edge size is defined as a width of an electron beam intensity distribution in the range where relative intensities are 0.1 to 0.9.

Figure 5C:
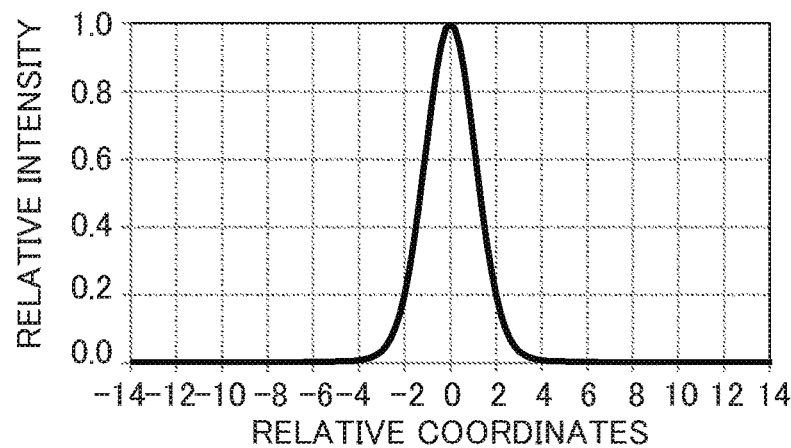
FIG. 5C is an electron beam intensity distribution of an edge size image.

Here, an ideal aperture image is an image obtained by multiplying the aperture shape of the aperture 153 in the aperture plate 154 by a projection magnification. A projection magnification of an aperture is determined by the three lenses in the reduction projection optical system. Meanwhile, an edge size is determined by an optical aberration and a beam vibration of the electron optical system. It is therefore difficult to measure the intensity distribution of an edge size image accurately but, if FIG. 5C is regarded as the intensity distribution of an edge size image caused by an optical aberration and a beam vibration, those causing an edge size, the electron beam intensity distribution of an aperture image shown in FIG. 5A is in the relationship of being formed as a convolution of two distributions of the electron beam intensity distribution of an ideal aperture image shown in FIG. 5B and the electron beam intensity distribution of an edge size image shown in FIG. 5C.

A method for improving the resolution of an SEM image obtained by using electron beams of an aperture image in a scanning electron microscope (refer to FIG. 1) on the basis of an electron beam intensity distribution of the aperture image is explained hereunder. The image processing is carried out by an image processing unit 148 (refer to FIG. 1). By this method, the resolution of an SEM image can be improved to a level close to the resolution of an edge size (hereunder referred to as edge resolution).

Firstly, the principle of improving the resolution of an SEM image by using electron beam intensity distribution information is explained. An SEM image (two-dimensional image information generated from detection signals of a detector): is represented as a convolution of sample information and electron beam intensity distribution information; and hence can be represented as an integration of the sample information and the electron beam intensity distribution information by using the nature of Fourier transformation (Num 1).

$$I = FT^{-1}(FT(S)FT(BP)) \quad \text{(Num 1)}$$

Here, I is an SEM image, S is sample information not including electron beam intensity distribution information, BP is electron beam intensity distribution information, FT represents Fourier transformation, and $FT^{-1}$ represents inverse Fourier transform. A reconstructed image reconstructed as sample information not including electron beam intensity distribution information therefore is obtained by deconvoluting the electron beam intensity distribution information from both the sides of the expression (Num 1). Specifically, the reconstructed image can be obtained by dividing a Fourier transformation of an SEM image I by a Fourier transformation of electron beam intensity distribution information BP and applying inverse Fourier transform to the divided value (Num 2).

$$S = FT^{-1}\left(\frac{FT(I)}{FT(BP)}\right) \quad \text{(Num 2)}$$

It is known that the resolution of an SEM image obtained by a scanning electron microscope can be improved by this deconvolution. As stated in Technical Problem however, when an image is acquired by an electron source image as in the past, it has been extremely difficult to accurately obtain the electron beam intensity distribution information of electron beams of the electron source image.

Figure 6:
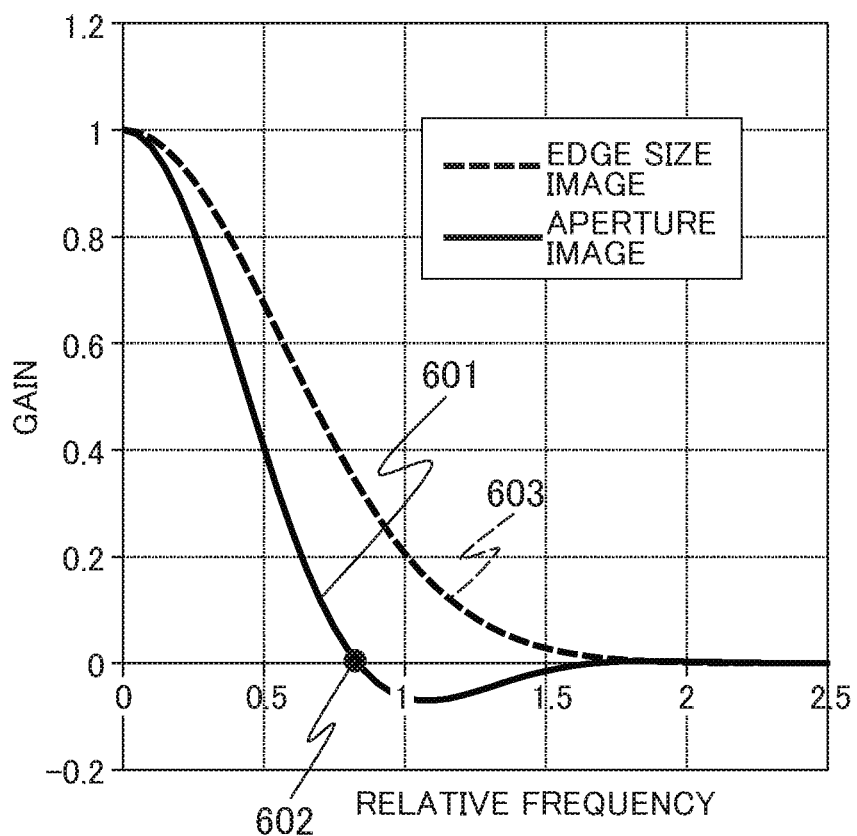
FIG. 6 is a graph showing gains of information transmission by an aperture image.

A waveform 601 in FIG. 6 is a gain (optical transfer function) of information transmission when an image is obtained by electron beams of an aperture image. The waveform 601 can be obtained by applying Fourier transformation (Num 3) to the electron beam intensity distribution of an aperture image shown in FIG. 5A.

$$g(w) = \left(\frac{1}{2\pi}\right) * \int_{-\infty}^{\infty} f(x)\sin(wx)\,dx \quad \text{(Num 3)}$$

Here, f(x) is an electron beam intensity distribution (waveform of FIG. 5A), g(w) is an information transmission gain, and w is an angular frequency (here, a relative frequency that is a relative value of an angular frequency is shown in FIG. 6).

As shown in the waveform 601, a gain lowers as an angular frequency (relative frequency) increases and comes to be zero once at a point 602 (referred to as "zero point frequency"). This means that information of a higher frequency is more hardly obtained. The absolute value of the gain however increases toward a still higher frequency region in excess of the zero point frequency 602. This is a feature in the case of using an aperture image and shows that there is a potential of being able to obtain a high resolution image. That is, information can be obtained up to a high frequency region in excess of the zero point frequency.

Specifically, the electron beam intensity distribution of an ideal aperture image (waveform of FIG. 5B) is applied to the electron beam intensity distribution information BP in the expression (Num 2). As stated earlier, since the electron beam intensity distribution of an aperture image is formed as a convolution of the electron beam intensity distribution of an ideal aperture image and the electron beam intensity distribution of an edge size image, the gain of the aperture image is the product of the gain of the ideal aperture image and the gain of the edge size image. Further, the gain of the ideal aperture image can be obtained from an aperture shape and a projection magnification through calculation. This means that an image obtained by electron beams equivalent to an edge size image can be restored by deconvoluting the electron beam intensity distribution information of the ideal aperture image from an SEM image obtained by the aperture image. The gain (waveform 603) when an image is obtained by beams equivalent to an edge size is shown together in FIG. 6. In this way, it can be understood that the information transmission gain improves more in the whole frequency band than the gain of information transmission by the electron beams of an aperture image.

A gain of an ideal aperture image can be obtained accurately by applying Fourier transformation to the rectangular profile (waveform of FIG. 5B) of the ideal aperture image estimated by the product of the aperture shape of an aperture 153 and a projection magnification and hence an image of an identical resolution (equivalent to an edge resolution) can be obtained by the image processing of the present method regardless of an aperture image size. That is, it shows that an image of a resolution close to a small electric current can be restored even when the size of an aperture image increases in accordance with a large electric current. The present method therefore exhibits a larger effect when an aperture image size is larger than an edge size. A size of 5 nm or larger is thought to be favorable in consideration of the ability of an ordinary electron optical system. In addition to that, since a pixel size during imaging is also a substantial resolution deteriorating factor, an aperture image size is desirably larger than a pixel size.

Meanwhile, the gain of an edge size image has to be known accurately in order to obtain a resolution higher than an edge resolution by image processing. Since it is difficult to accurately grasp a beam vibration and the like defining an edge size image, a resolution obtained by image processing of the present method is also comparable to an edge resolution. Resolution deterioration caused by an aperture image size however can be relieved by the present method and the advantage of applying the present method is particularly large under large current conditions (for example, optical conditions in the observation of the bottom of a deep groove or a deep hole or the like) where the primary cause of the resolution deterioration is a beam size.

Here, as shown in FIG. 6, a frequency incapable of information transmission ("zero point frequency") appears by the present method. This is because the calculation diverges undesirably even if the information is tried to be restored at the frequency at which the gain is zero. One method to cope with this is a method of estimating the information of the zero point frequency by using data of frequencies around the zero point frequency. As an example of a simple method, a method of applying function fitting to a distribution in the vicinity of the target frequency in the Fourier transformation of an acquired image is named.

Figure 7:
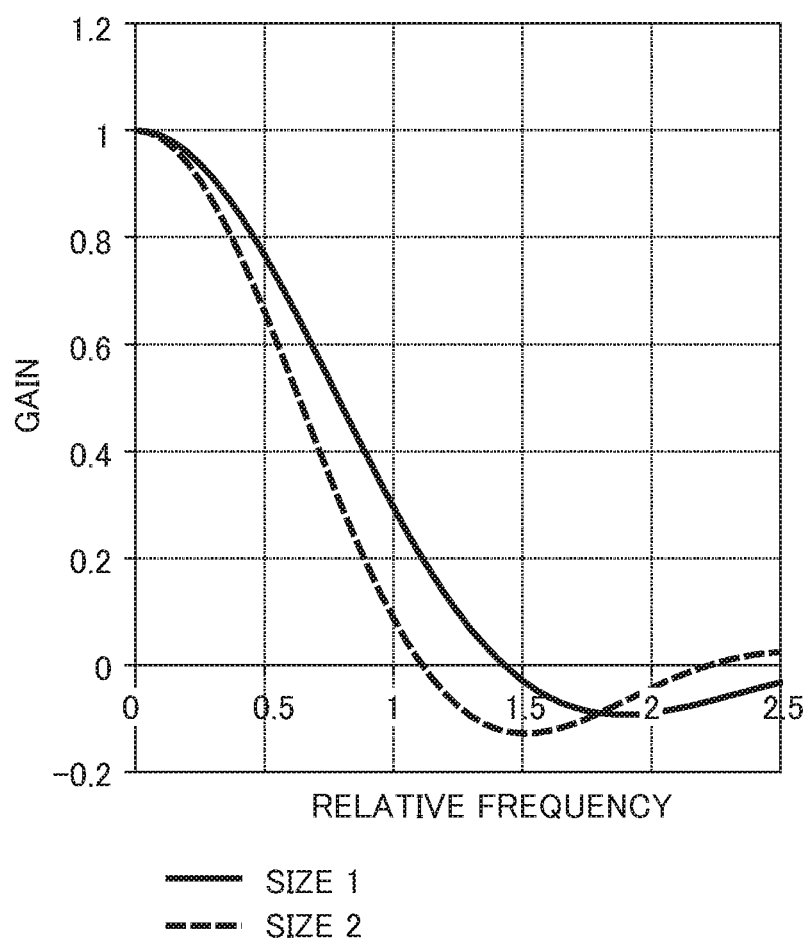
FIG. 7 is a graph showing gains of information transmission by two aperture images of different sizes.

Otherwise, it is also possible to obtain a plurality of images and apply image processing. The gains of aperture images that have different sizes but an identical aperture angle are shown in FIG. 7. Images of aperture images having different sizes can be acquired by using at least either of different projection magnifications or different aperture shapes. On this occasion, as shown in FIG. 7, the zero point frequency varies by aperture images and more accurate image processing comes to be possible by using the two-dimensional image information of an aperture image having a larger gain value even with an identical frequency. Since the optical aberration that is the primary factor of an edge resolution depends on an aperture angle, even if the sizes of aperture images are different, an edge resolution that is the target of the resolution restoration can be equalized by setting optical conditions so as to equalize aperture angles.

Meanwhile, when an SN of an SEM image acquired from a detector is low, if a resolution is improved by image processing of the present method, the influence of noise is also amplified and a processed image is rather badly influenced in some cases. It is therefore desirable to: assign an image processing parameter P to define the extent of resolution improvement at an image processing unit 148; and improve the resolution of an SEM image in accordance with the image processing parameter P.

Figure 8:
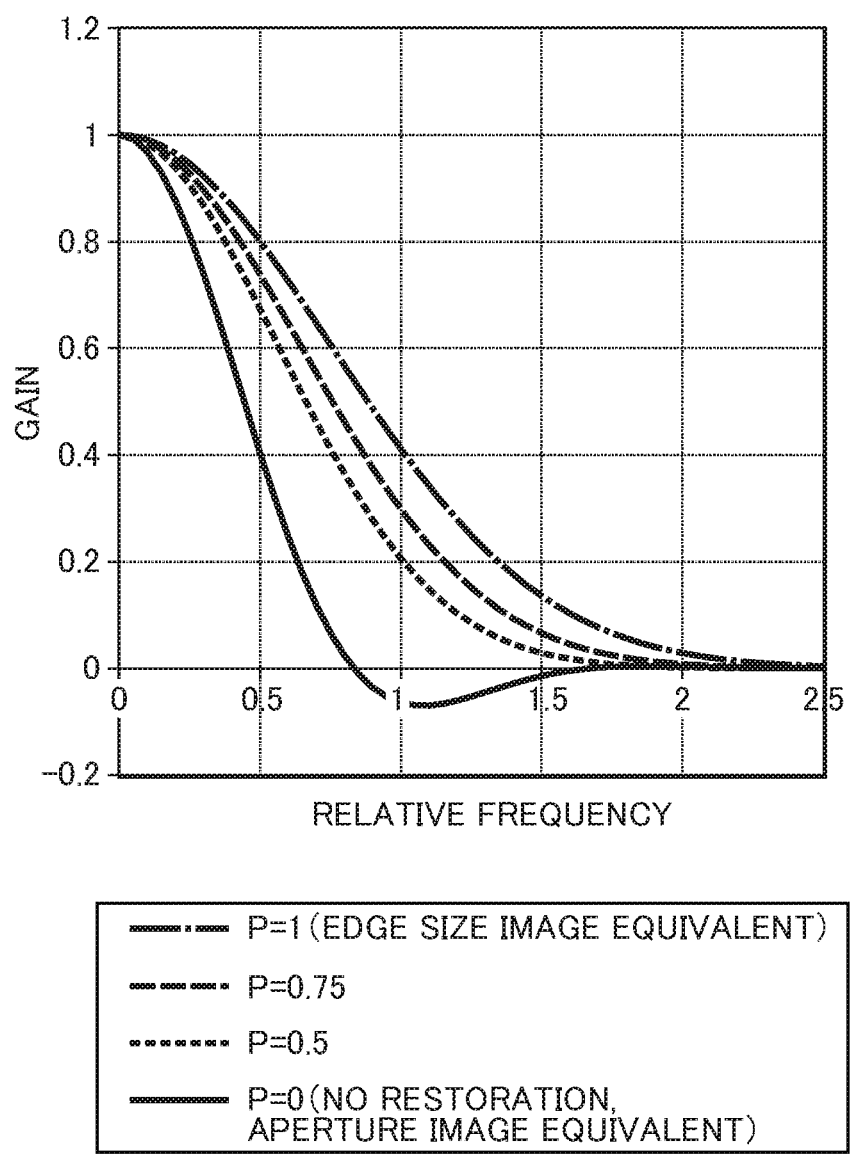
FIG. 8 is a graph showing gains of information transmission of restoration images for image processing parameters P.

Here, □ is defined as (gain of edge size image)/(gain of aperture image) and image processing is carried out so that a resolution improvement index G may come to be (□P+(1−P)) for example. When P is 1, G is □ and an SEM image improves to the edge resolution and, when P is 0, G is 1 and restoration is not applied. When P is in the expression 0<P<1, intermediate resolution improvement is obtained. Gains of information transmission for respective image processing parameters P are shown in FIG. 8. In this way, by assigning an image processing parameter P, the present method can be applied also to an image of a low SN and can improve a resolution. Here, the resolution improvement index G is not limited to the above example. Any index is acceptable as long as the index is a function satisfying the expressions G=☐ when P=1, G=1 when P=0, and G=☐ to 1 when 0<P<1.

Figure 9:
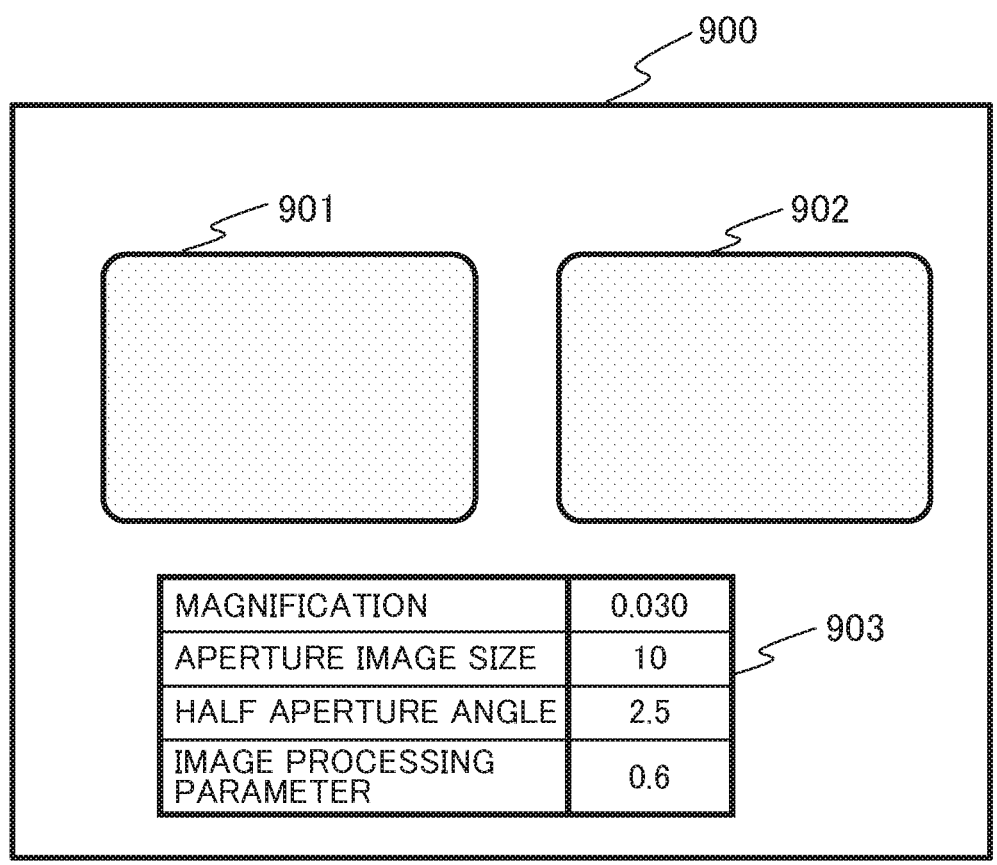
FIG. 9 shows an example of a GUI displayed in a display device.

An example of a GUI (Graphical User Interface) displayed on a display device 147 is shown in FIG. 9. A pre-image-processing image 901 and a post-image-processing image 902 are displayed on a screen 900 because the resolution of an image is varied largely by image processing. As a result, images before and after processing can be compared and an acquired image can be judged comprehensively. Further, parameters essential to the present method are displayed at a parameter display section 903. In the displayed parameters, a magnification, an aperture image size, a half aperture angle (½ of aperture angle (refer to FIG. 4A)), and an image processing parameter P are included. The unit of an aperture image size is "nm" and the unit of a half aperture angle is "mrad". An operator can adjust and decide optical parameters or optimize image processing easily by setting those values at the parameter display section 903.

Figure 10:
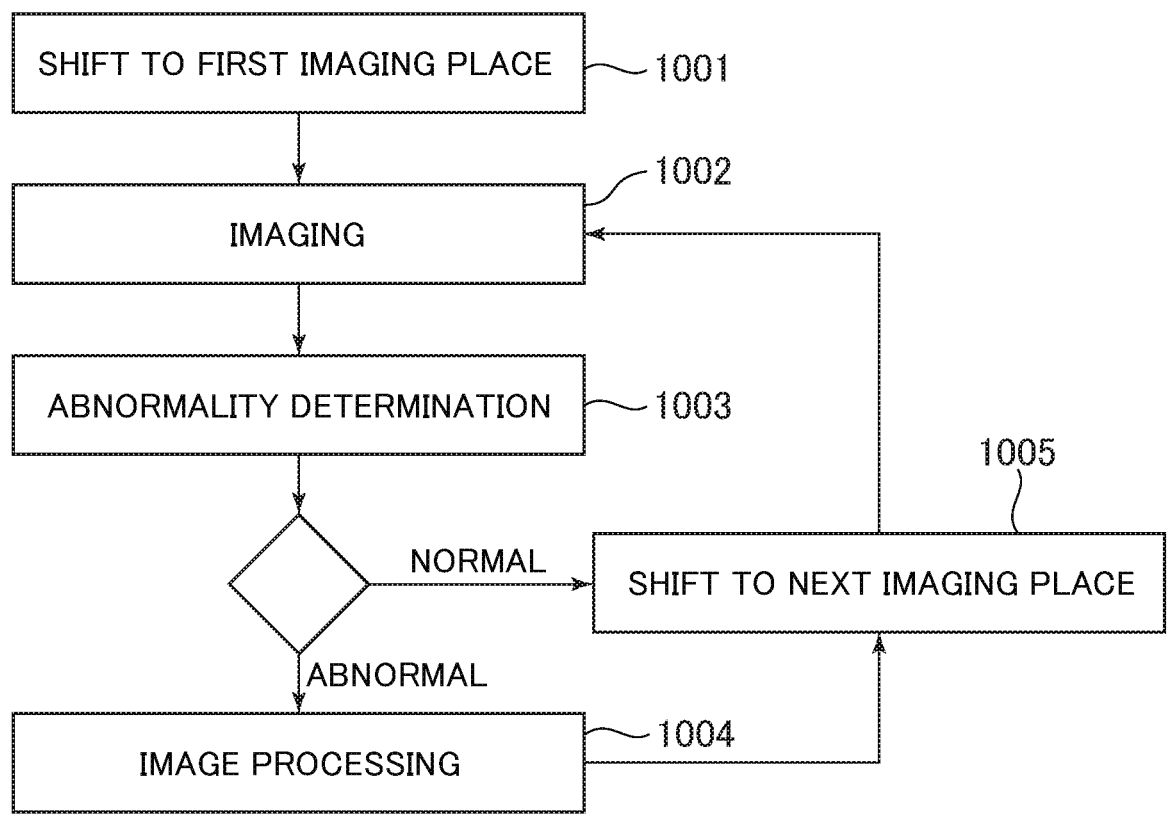
FIG. 10 is a flowchart for high-speed inspection.

An inspection method of a sample using an electron beam device according to the present embodiment is explained hereunder. A flowchart for high-speed inspection is shown in FIG. 10. When a three-dimensional shape such as a deep hole, a deep groove, or the like is inspected, since optical conditions of a small aperture angle and a large electric current are set, an aperture image size increases and the resolution of an SEM image acquired by image processing of the present method can be improved. When defect inspection is the purpose however, image processing is not necessarily applied to all places. An electron beam shifts to a first imaging place (Step 1001), an image is photographed (Step 1002), and the photographed SEM image (two-dimensional image information generated from detection signals) is subjected to abnormality determination by an abnormality determination unit 149. When the photographed SEM image is judged to have a defect candidate, a high-resolution defect analysis image is formed by image processing at an image processing unit 148 (Step 1004). When the photographed SEM image is judged not to have a defect candidate, the electron beam shifts to a next imaging place (Step 1005).

Figure 11:
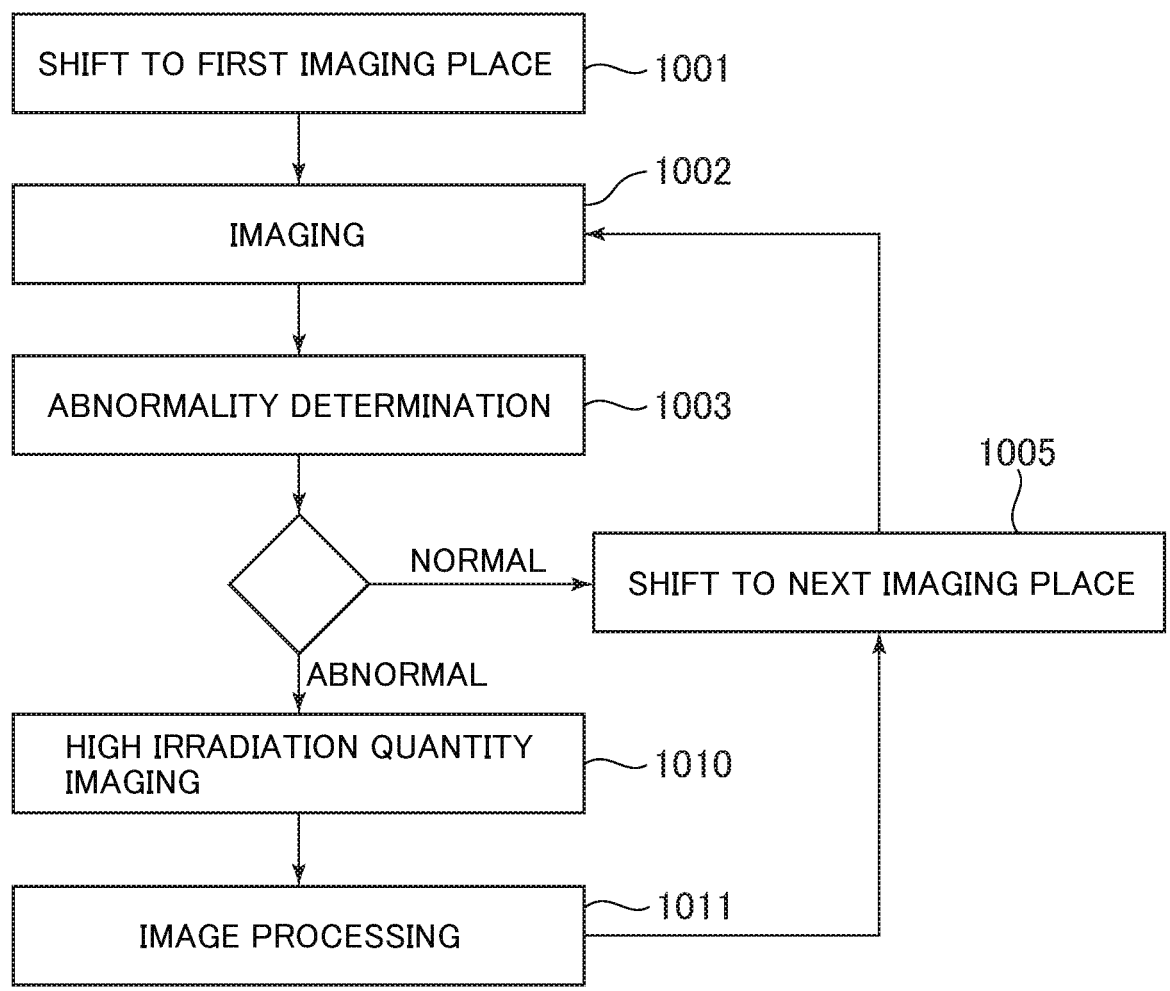
FIG. 11 is another flowchart for high-speed inspection.

FIG. 11 is another flowchart for high-speed inspection. In this example, when a photographed SEM image is judged to have a defect candidate, an image is photographed additionally by increasing the total irradiation quantity of an electron beam to the region where the defect candidate is judged to exist and a SEM image having an SN improved more than Step 1002 is obtained (Step 1010). A high-resolution defect analysis image is formed by applying image processing to the SEM image having an improved SN at the image processing unit 148 (Step 1011). As a result, defect analysis can be carried out by mitigating the influence of noise during image processing.

Figure 12:
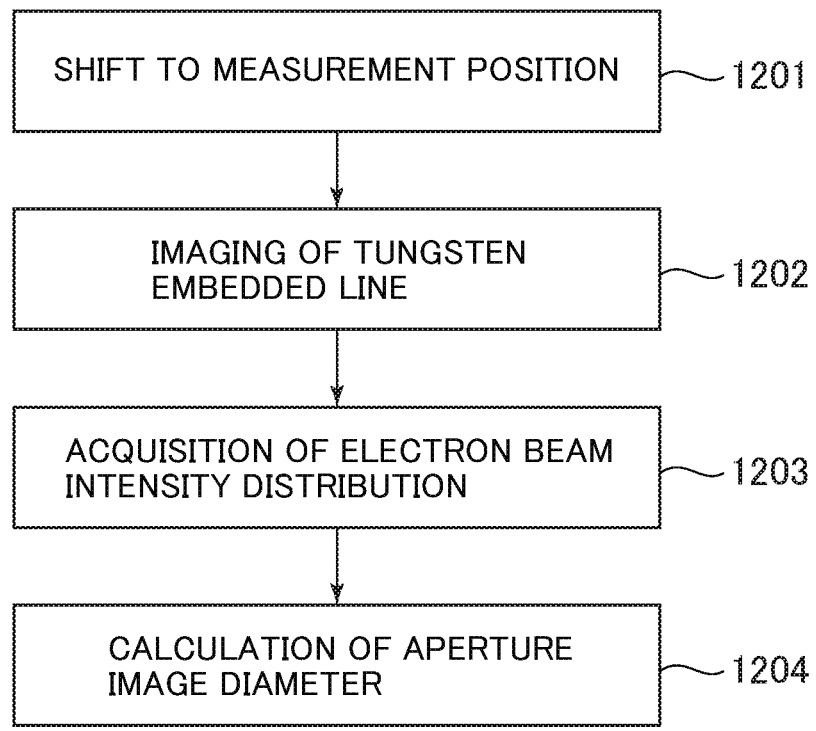
FIG. 12 is a flowchart of measuring an aperture image size.

Meanwhile, it has been explained earlier that an aperture image size is obtained by calculation on the basis of an aperture shape of a first aperture 153 in a first aperture plate 154 and a projection magnification. An accurate projection magnification of an electron beam device however is not known in some cases. On this occasion, an aperture image size can be obtained from a real device. A flowchart of measuring an aperture image size is shown in FIG. 12. In this example, a tungsten line pattern embedded into silicon is used as a measurement mark. Firstly, an electron beam shifts to the place of the measurement mark (Step 1201). Successively, the tungsten embedded line is photographed (Step 1202) and a one-dimensional electron beam intensity distribution is obtained (Step 1203). The intensity distribution of the aperture image has a semicircular shape. A diameter of the aperture image is calculated from the electron beam intensity distribution on the basis of the fact that the aperture 153 has a round shape (Step 1204). Since the shape of the aperture 153 is known, an aperture image size can be estimated with a high degree of accuracy and image processing can be carried out with a high degree of accuracy even when a projection magnification of a device is unknown. Here, the purpose of using an embedded line structure is to avoid the deformation of an electron beam intensity distribution caused by the edge effect of secondary electron emission.

Moreover, a method of reducing machine difference of a plurality of electron beam devices to inspect a sample is explained. The overall configuration of each of the devices is equivalent to the overall configuration shown in FIG. 1 and a sample is inspected by using any one of the devices. Information on an aperture shape is stored in a recording device 145 and an aperture image size is calculated at a device control unit 146 by using a projection magnification of a reduction projection optical system obtained from excitation parameters of electromagnetic lenses controlling a first reducing lens control unit 161, a second reducing lens control unit 162, and an objective lens control unit 142 and aperture shape data. Here, an aperture is regarded as a round aperture and an aperture image size is represented by the diameter of a round aperture image.

Figure 13:
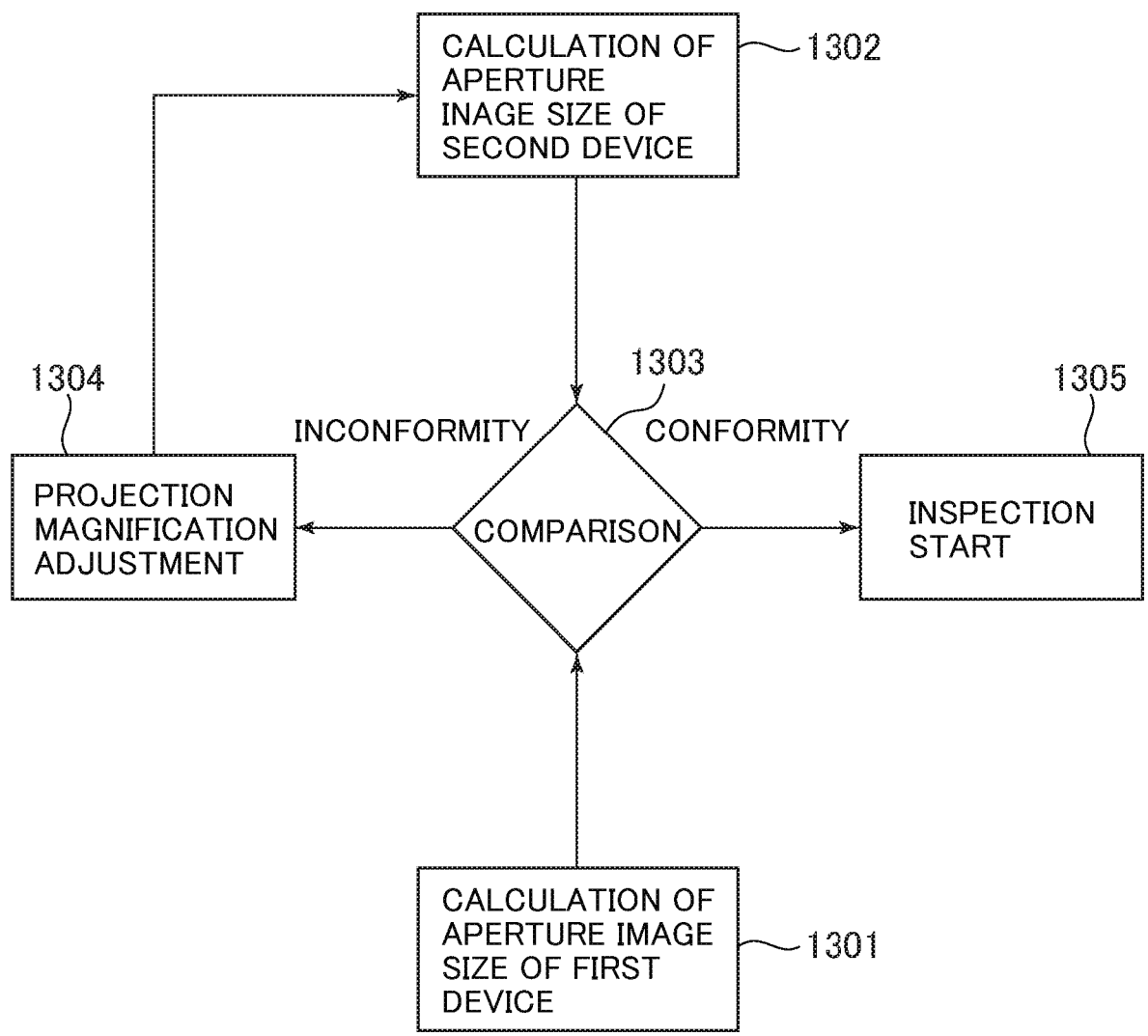
FIG. 13 is a flowchart of reducing machine difference between a plurality of electron beam devices.

A flowchart of machine difference reduction is shown in FIG. 13. Firstly an aperture image size of a first device is obtained (Step 1301) and successively an aperture image size of a second device is obtained (Step 1302). Both the sizes are compared (Step 1303) and, when they are different, the second aperture image size is adjusted by controlling the projection magnification of the second device with the first aperture image size used as the reference (Step 1304). As a result, inspection can be carried out while the machine difference caused by the difference between the aperture image size of the first device and the aperture image size of the second device is reduced (Step 1305). At Step 1305, a flow for high-speed inspection explained in FIG. 10 or 11 may also be applied. When target devices further exist, the machine difference of the multiple devices can be controlled by applying the present method expansively to a third device and a fourth device. Here, when a projection magnification is adjusted, a first condenser lens and a second condenser lens are adjusted so as not to change an aperture angle of an aperture image.

A conventional device using an electron source image has the disadvantages that a correct estimation of an electron source image is difficult and a beam vibration caused by external disturbance and the like is conspicuous because a magnification is large with a large current. The beam vibration is related to the entire device, hence is hardly controllable, and is a major obstacle to the reduction of machine difference. The present method of using an aperture image therefore is thought to be effective also from the viewpoint of reducing machine difference.

Meanwhile, the present invention is not limited to the aforementioned embodiments and includes various modified examples. For example, the aforementioned embodiments are explained in order to make the present invention easy to understand and not necessarily limited to the cases having all the explained configurations. Further, it is possible to: replace a part of a configuration of an example with a configuration of another example; and also add a configuration of an example to a configuration of another example. Furthermore, it is also possible to add, delete, or replace a part of a configuration in each of the examples to, from, or with another configuration. Moreover, the present invention is not limited to the inspection of a deep groove or a deep hole and is widely effective when imaging is carried out under a large current.

LIST OF REFERENCE SIGNS

101: Electron gun, 102: First aligner, 103: First condenser lens, 105: Second condenser lens, 106: First scanning deflector, 108: Second scanning deflector, 113: Objective lens, 114: Sample, 115: Stage, 116: Primary electron, 117: Secondary electron, 121: First detector, 122: Second detector, 131: Electron gun control unit, 132: First aligner control unit, 133: First condenser lens control unit, 135: Second condenser lens control unit, 136: First detection system control unit, 137: First scanning deflector control unit, 138: Second detection system control unit, 139: Second scanning deflector control unit, 141: Booster voltage control unit, 142: Objective lens control unit, 144: Sample voltage control unit, 145: Recording device, 146: Device control unit, 147: Display device, 148: Image processing unit, 149: Abnormality determination unit, 150: Aperture irradiation lens, 151: First reducing lens, 152: Second reducing lens, 153: First aperture, 154: First aperture plate, 155: Aperture plate stage, 160: Aperture irradiation lens control unit, 161: First reducing lens control unit, 162: Second reducing lens control unit, 163: Aperture position control unit, 201: Electron source reference trajectories, 202: Aperture reference trajectories, 210: Electron source first intermediate image, 211: Electron source second intermediate image, 212: Electron source third intermediate image, 213: Electron source image, 220: Aperture intermediate image, 221: Aperture image, 251: Aperture right-end trajectories, 252: Aperture left-end trajectories, 402: Aperture angle, 403: Incidence angle, 953: Second aperture, 954: Second aperture plate

The invention claimed is:

1. An electron beam device,
wherein the electron beam device has
an electron optical system having an irradiation optical system to irradiate a first aperture with an electron beam emitted from an electron source and a reduction projection optical system to project and form an aperture image of the first aperture on a sample,
a detector to detect secondary electrons emitted by irradiating the sample with the electron beam through the electron optical system, and
an image processing unit to generate a two-dimensional image from detection signals of the detector obtained by irradiating the sample with the electron beam while the electron beam scans the sample two-dimensionally by a scanning deflector of the electron optical system; and
the image processing unit generates a reconstructed image by deconvoluting electron beam intensity distribution information of an ideal aperture image of the first aperture from two-dimensional image information generated from the detection signals.

2. The electron beam device according to claim 1, wherein the first aperture is a round aperture.

3. The electron beam device according to claim 1, wherein the image processing unit calculates the electron beam intensity distribution information of the ideal aperture image as a product of an aperture shape of the first aperture and a projection magnification of the reduction projection optical system.

4. The electron beam device according to claim 1, wherein the image processing unit estimates information of a zero point frequency at which an information transmission gain is zero by using data of frequencies around the zero point frequency.

5. The electron beam device according to claim 1, wherein the image processing unit generates the reconstructed image by using first two-dimensional image information obtained by projecting and forming a first aperture image of the first aperture on the sample and second two-dimensional image information obtained by projecting and forming a second aperture image, the size of which is different from the size of the first aperture image, of the first aperture on the sample.

6. The electron beam device according to claim 5, wherein the electron optical system projects and forms the second aperture image on the sample by differentiating at least either of an aperture shape of the first aperture when the first aperture image is projected and formed on the sample and a projection magnification of the reduction projection optical system.

7. The electron beam device according to claim 6, wherein the electron optical system is set so that an aperture angle when the first aperture image is projected and formed on the sample may be equal to an aperture angle when the second aperture image is projected and formed on the sample.

8. The electron beam device according to claim 1, wherein the image processing unit generates the reconstructed image having a resolution improved to the extent of conforming to an assigned image processing parameter.

9. The electron beam device according to claim 1,
wherein the electron beam device has an abnormality determination unit to extract a defect candidate from two-dimensional image information generated from the detection signals; and
the image processing unit generates the reconstructed image as for two-dimensional image information generated from the detection signals when the abnormality determination unit extracts a defect candidate.

10. The electron beam device according to claim 9, wherein the image processing unit generates the reconstructed image as for two-dimensional image information generated from detection signals obtained by increasing a total irradiation quantity to a region where the abnormality determination unit extracts a defect candidate and photographing an image.

11. The electron beam device according to claim 1,
wherein the reduction projection optical system has a second aperture; and
a size of the second aperture is larger than a half width of the electron beam at an aperture position.

12. A sample inspection method of inspecting a sample by using a first electron beam device and a second electron beam device, each of the first and second electron beam devices having
an electron optical system having an irradiation optical system to irradiate an aperture with an electron beam emitted from an electron source and a reduction projection optical system to project and form an aperture image of the aperture on the sample, a detector to detect secondary electrons emitted by irradiating the sample with the electron beam through the electron optical system, and an image processing unit to generate a two-dimensional image from detection signals of the detector by irradiating the sample with the electron beam while the electron beam scans the sample two-dimensionally by a scanning deflector of the electron optical system, wherein the sample inspection method includes the processes of:

calculating a size of the aperture image of the first electron beam device on the basis of an aperture shape of the aperture and a projection magnification of the reduction projection optical system in the first electron beam device;

calculating a size of the aperture image of the second electron beam device on the basis of an aperture shape of the aperture and a projection magnification of the reduction projection optical system in the second electron beam device; and when the size of the aperture image of the first electron beam device and the size of the aperture image of the second electron beam device are different from each other, adjusting a projection magnification of the reduction projection optical system in the second electron beam device so that the size of the aperture image of the second electron beam device may be equal to the size of the aperture image of the first electron beam device.

13. The sample inspection method according to claim 12, wherein the image processing unit in each of the first electron beam device and the second electron beam device generates a reconstructed image by deconvoluting electron beam intensity distribution information of an ideal aperture image of the aperture from two-dimensional image information generated from the detection signals.

* * * * *